US008843335B2

(12) United States Patent
Pupalaikis et al.

(10) Patent No.: US 8,843,335 B2
(45) Date of Patent: Sep. 23, 2014

(54) WAVELET DENOISING FOR TIME-DOMAIN NETWORK ANALYSIS

(75) Inventors: Peter J. Pupalaikis, Ramsey, NJ (US); Anirudh Sureka, Mamaroneck, NY (US); Kaviyesh Doshi, Pearl River, NY (US)

(73) Assignee: Teledyne LeCroy, Inc., Thousand Oaks, CA (US)

( * ) Notice: Subject to any disclaimer, the term of this patent is extended or adjusted under 35 U.S.C. 154(b) by 873 days.

(21) Appl. No.: 12/890,832

(22) Filed: Sep. 27, 2010

(65) Prior Publication Data

US 2011/0191047 A1 Aug. 4, 2011

Related U.S. Application Data

(60) Provisional application No. 61/300,149, filed on Feb. 1, 2010, provisional application No. 61/300,160, filed on Feb. 1, 2010, provisional application No. 61/300,230, filed on Feb. 1, 2010, provisional application No. 61/355,182, filed on Jun. 16, 2010.

(51) Int. Cl.
*G01R 29/26* (2006.01)
*G06F 19/00* (2011.01)
*G06F 17/18* (2006.01)

(52) U.S. Cl.
CPC ............... *G01R 29/26* (2013.01); *G06F 19/00* (2013.01); *G06F 17/18* (2013.01)
USPC ........................................................ 702/69

(58) Field of Classification Search
CPC ...................................................... G01R 29/26
USPC ........................................................ 702/69
See application file for complete search history.

(56) References Cited

U.S. PATENT DOCUMENTS

| | | | | |
|---|---|---|---|---|
| 5,497,777 A * | 3/1996 | Abdel-Malek et al. | ....... | 600/443 |
| 6,993,458 B1 * | 1/2006 | Castelli et al. | ............... | 702/186 |
| 7,260,272 B2 * | 8/2007 | Lin et al. | ....................... | 382/275 |
| 2004/0230387 A1 * | 11/2004 | Bechhoefer | ..................... | 702/58 |
| 2005/0100226 A1 * | 5/2005 | Kajiwara et al. | .............. | 382/232 |
| 2005/0265629 A1 * | 12/2005 | Fu et al. | ....................... | 382/275 |
| 2006/0262993 A1 * | 11/2006 | Yang | ............................. | 382/275 |
| 2010/0076693 A1 * | 3/2010 | Liang et al. | .................... | 702/22 |
| 2010/0145667 A1 * | 6/2010 | Niu et al. | .......................... | 703/5 |

OTHER PUBLICATIONS

Andrews, James R., Time Domain Reflectometery (TDR) and Time Domain Transmission (TDT) Measurement Fundamentals, AN-30415, Revision 1, Nov. 2004.*

(Continued)

*Primary Examiner* — John Breene
*Assistant Examiner* — Timothy H Hwang
(74) *Attorney, Agent, or Firm* — Gordon Kessler

(57) ABSTRACT

A method and apparatus are provided for the removal of significant broad-band noise from waveforms acquired for time domain network analysis. The method may include the steps of providing the noisy waveform as an input waveform, determining a frequency domain noise shape associated with the input waveform, calculating a wavelet domain noise shape from the frequency domain noise shape, calculating a discrete wavelet transform of the input waveform to form a wavelet domain waveform, and estimating the noise statistics from the wavelet domain waveform. A threshold may be calculated from the estimated noise statistics and the wavelet domain noise shape, and the threshold may be applied to the wavelet domain waveform to form a denoised wavelet domain waveform. Finally, an inverse discrete wavelet transform of the denoised wavelet domain waveform may be calculated to form a denoised waveform.

33 Claims, 20 Drawing Sheets

(56) References Cited

OTHER PUBLICATIONS

Roy et al., Simple Denoising Algorithm Using Wavelet Transform, AIChE Journal, vol. 45, No. 11, Nov. 1999, pp. 2461-2466.*

Polikar, Robi "The Wavelet Tutorial", *Part IV—Multiresolution analysis: The Discrete Wavelet Transform*, Originally developed and hosted (1994-2000) at Iowa State University,(1994),11 pages.

Nicolson, A. M., "Forming the Fast Fourier Transform of a Step Response in Time-Domain Metrology", *Electronics Letters*, vol. 9 No. 14, (Jul. 1973),317-318.

Haar, Alfred "On the Theory of Orthogonal Function Systems", *Mathematische Annalen*, 69, Translated by Georg Zimmermann,(Jul. 1909),331-371.

Gans, William L., et al., "Continuous and Discrete Fourier Transforms of Steplike Waveforms", *IEEE Transactions on Instrumentation and Measurement*, vol. IM-31, No. 2, (Jun. 1982),97-101.

\* cited by examiner

| Haar | Daubechie's-12 | Daubechie's-16 | Daubechie's-20 |
|---|---|---|---|
| 1 | 0.15774243 | 0.07695562 | 0.03771716 |
| 1 | 0.69950381 | 0.44246725 | 0.26612218 |
|  | 1.06226376 | 0.95548615 | 0.74557507 |
| Daubechie's-4 | 0.44583132 | 0.82781653 | 0.97362811 |
| 0.6830127 | -0.3199866 | -0.02238574 | 0.39763774 |
| 1.1830127 | -0.18351806 | -0.40165863 | -0.3533362 |
| 0.3169873 | 0.13788809 | 0.000668194 | -0.27710988 |
| -0.1830127 | 0.03892321 | 0.18207636 | 0.18012745 |
|  | -0.04466375 | -0.0245639 | 0.13160299 |
| Daubechie's-6 | 0.000783251252 | -0.06235021 | -0.10096657 |
| 0.47046721 | 0.00675606236 | 0.01977216 | -0.04165925 |
| 1.14111692 | -0.00152353381 | 0.01236884 | 0.04696981 |
| 0.650365 |  | -0.00688771926 | 0.00510043697 |
| -0.19093442 | Daubechie's-14 | -0.000554004549 | -0.015179 |
| -0.12083221 | 0.11009943 | 0.000955229711 | 0.00197332536 |
| 0.0498175 | 0.56079128 | -0.000166137261 | 0.00281768659 |
|  | 1.03114849 |  | -0.00096994784 |
| Daubechie's-8 | 0.66437248 | Daubechie's-18 | -0.000164709006 |
| 0.32580343 | -0.20351382 | 0.05385035 | 0.000132354367 |
| 1.01094572 | -0.31683501 | 0.3448343 | -1.875841E-05 |
| 0.8922014 | 0.1008467 | 0.85534906 |  |
| -0.03957503 | 0.11400345 | 0.92954571 |  |
| -0.26450717 | -0.05378245 | 0.18836955 |  |
| 0.0436163 | -0.02343994 | -0.41475176 |  |
| 0.0465036 | 0.01774979 | -0.13695355 |  |
| -0.01498699 | 0.000607514995 | 0.21006834 |  |
|  | -0.00254790472 | 0.043452675 |  |
| Daubechie's-10 | 0.000500226853 | -0.09564726 |  |
| 0.22641898 |  | 0.000354893 |  |
| 0.85394354 |  | 0.03162417 |  |
| 1.02432694 |  | -0.00667962023 |  |
| 0.19576696 |  | -0.00605496058 |  |
| -0.34265671 |  | 0.00261296728 |  |
| -0.04560113 |  | 0.000325814671 |  |
| 0.10970265 |  | -0.000356329759 |  |
| -0.0088268 |  | 5.5645514E-05 |  |
| -0.01779187 |  |  |  |
| 0.00471742793 |  |  |  |

FIG. 13 PRIOR ART

| DWT(x, h) |
|---|
| $L \leftarrow \text{rows}(\mathbf{h})$ |
| $N \leftarrow \text{rows}(\mathbf{x})$ |
| $B \leftarrow \log_2(N) - \log_2(L) + 1$ |
| $\lambda \in 0 \ldots L-1$ |
| $\quad \mathbf{g}[\lambda] \leftarrow (-1)^\lambda \mathbf{h}[L-1-\lambda]$ |
| $i \in 0 \ldots B-1$ |
| $\quad k \in 0 \ldots N/2 - 1$ |
| $\quad\quad \mathbf{X}[k] \leftarrow \sum_{\lambda=0}^{L-1} \mathbf{x}[\text{mod}(2k+\lambda, N)] \mathbf{h}[\lambda]$ |
| $\quad\quad \mathbf{X}[k+N/2] \leftarrow \sum_{\lambda=0}^{L-1} \mathbf{x}[\text{mod}(2k+\lambda+N-2, N)] \cdot \mathbf{g}[\lambda]$ |
| $\quad \mathbf{x} \leftarrow \mathbf{X}$ |
| $\quad N \leftarrow N/2$ |
| *return* $\mathbf{X}$ |

FIG. 20 PRIOR ART

| IDWT(X, h) |
|---|
| $L \leftarrow \text{rows}(\mathbf{h})$ |
| $N \leftarrow \text{rows}(\mathbf{X})$ |
| $B \leftarrow \log_2(N) - \log_2(L) + 1$ |
| $\lambda \in 0 \ldots L-1$ |
| $\quad \mathbf{g}[\lambda] \leftarrow (-1)^\lambda \mathbf{h}[L-1-\lambda]$ |
| $N \leftarrow L$ |
| $i \in 0 \ldots B-1$ |
| $\quad \mathbf{x} \leftarrow \mathbf{X}$ |
| $\quad k \in 0 \ldots N/2 - 1$ |
| $\quad\quad \mathbf{x}[2k] \leftarrow \sum_{\lambda=0}^{\frac{L}{2}-1} \mathbf{h}[2\lambda]\mathbf{X}\left[\text{mod}\left(k-\lambda+\frac{N}{2},\frac{N}{2}\right)\right]\ldots$ $+\mathbf{g}[2\lambda]\mathbf{X}\left[\text{mod}\left(k+1-\lambda+\frac{N}{2},\frac{N}{2}\right)+\frac{N}{2}\right]$ |
| $\quad\quad \mathbf{x}[2k+1] \leftarrow \sum_{\lambda=0}^{\frac{L}{2}-1} \mathbf{h}[2\lambda+1]\mathbf{X}\left[\text{mod}\left(k-\lambda+\frac{N}{2},\frac{N}{2}\right)\right]\ldots$ $+\mathbf{g}[2\lambda+1]\mathbf{X}\left[\text{mod}\left(k+1-\lambda+\frac{N}{2},\frac{N}{2}\right)+\frac{N}{2}\right]$ |
| $\quad \mathbf{X} \leftarrow \mathbf{x}$ |
| $\quad N \leftarrow 2N$ |
| *return* $\mathbf{x}$ |

FIG. 21 PRIOR ART

| DWTNoiseShapeCalc(E, h) | —— 68 |
|---|---|
| $L \leftarrow \text{rows}(\mathbf{h})$ | |
| $N \leftarrow \text{rows}(\mathbf{E}) - 1$ | |
| $B \leftarrow \log_2(N) - \log_2(L) + 2$ | —— 69 |
| $i \in 0 \ldots B-2$ | —— 70 |
| $\quad \mathbf{S}[B-1-i] \leftarrow \sqrt{\sum_{n=0}^{N}\left(\lvert\mathbf{E}[n]\rvert \left\lvert\sum_{\lambda=0}^{L-1}(-1)^{\lambda}\mathbf{h}[L-1-\lambda]e^{-j\pi\frac{n\lambda}{N}}\right\rvert\right)^2}$ | —— 71 |
| $\quad n \in 0 \ldots N/2$ | —— 72 |
| $\quad\quad \mathbf{E}[n] \leftarrow \sqrt{\left(\lvert\mathbf{E}[n]\rvert\left\lvert\sum_{\lambda=0}^{L-1}h[\lambda]e^{-j\pi\frac{n\lambda}{N}}\right\rvert\right)^2 \ldots + \left(\lvert\mathbf{E}[N-n]\rvert\left\lvert\sum_{\lambda=0}^{L-1}h[\lambda]e^{-j\pi\frac{(N-n)\lambda}{N}}\right\rvert\right)^2}$ | —— 73 |
| $\quad N \leftarrow N/2$ | —— 74 |
| $\mathbf{S}[0] \leftarrow \sqrt{\sum_{n=0}^{N}\lvert\mathbf{E}[n]\rvert^2}$ | —— 75 |
| return S | —— 76 |

FIG. 22

| DerivativeThresholdCalc($\mathbf{X}, \mathbf{h}, pct$) | — 77 |
|---|---|
| $L \leftarrow \text{rows}(\mathbf{h})$ | |
| $K \leftarrow \text{rows}(\mathbf{X})$ | |
| $N \leftarrow K/2$ | — 78 |
| $B \leftarrow \log_2(K) - \log_2(L) + 1$ | — 79 |
| $n \in 0 \ldots N$ | — 80 |
| $\mathbf{E}[n] \leftarrow \sqrt{2\left[1 - \cos\left(\pi \frac{n}{N}\right)\right]}$ | — 81 |
| $\mathbf{TS} \leftarrow \text{DWTNoiseShapeCalc}(\mathbf{E}, \mathbf{h})$ | — 82 |
| $P \leftarrow \text{floor}\left(\frac{K}{2} \frac{pct}{100}\right)$ | — 83 |
| $\bar{X} \leftarrow \frac{1}{P} \sum_{k=K-P}^{K-1} \mathbf{X}[k]$ | — 84 |
| $\sigma_w \leftarrow \sqrt{\frac{1}{P} \sum_{k=K-P}^{K-1} (\mathbf{X}[k] - \bar{X})^2}$ | — 85 |
| $\sigma \leftarrow \sigma_w \cdot \sqrt{N} / \mathbf{TS}[B-1]$ | — 86 |
| $k \in 0 \ldots K-1$ | — 87 |
| $b \leftarrow \text{floor}(\log_2(\max(L/2, k) + 0.5)) - \log_2(L/2)$ | — 88 |
| $\mathbf{th}_k \leftarrow \mathbf{TS}_b \frac{\sigma}{\sqrt{N}}$ | — 89 |
| *return* $\mathbf{th}$ | — 90 |

FIG. 23

| DenoisedDerivativeCalc(x, h) | — 91
|---|---
| $\mathbf{X} \leftarrow \text{DWT}(\mathbf{x}, \mathbf{h})$ | — 92
| $\mathbf{T} \leftarrow \text{DerivativeThresholdCalc}(\mathbf{X}, \mathbf{h}, 30) \cdot 5$ | — 93
| $K \leftarrow \text{rows}(\mathbf{X})$ | — 94
| $k \in 0 \ldots K-1$ | — 95
| $|\mathbf{X}[k]| \geq \mathbf{T}[k]$ ? | — 96
| false / true |
| 97 — $\mathbf{XD}[k] \leftarrow 0$   $\mathbf{XD}[k] \leftarrow \mathbf{X}[k]$ — 98 |
| $\mathbf{xd} \leftarrow \text{IDWT}(\mathbf{XD}, \mathbf{h})$ | — 99
| *return* xd | — 100

FIG. 24

WAVELET DENOISING FOR TIME-DOMAIN NETWORK ANALYSIS

CROSS REFERENCE TO RELATED APPLICATIONS

This application claims the benefit of U.S. Provisional Patent Application 61/300,149, filed Feb. 1, 2010 titled "Wavelet Denoising" to Pupalaikis et al.; U.S. Provisional Patent Application 61/300,160, filed Feb. 1, 2010 titled "Wavelet Denoising" to Pupalaikis et al.; U.S. Provisional Patent Application 61/300,230, filed Feb. 1, 2010 titled "Time Domain Reflectometry Step to S-Parameter Conversion" to Pupalaikis et al.; and U.S. Provisional Patent Application 61/355,182, filed Jun. 16, 2010 titled "Wavelet Denoising for Time-Domain Network Analysis" to Pupalaikis et al., the contents of each of these applications being incorporated herein by reference.

FIELD OF THE INVENTION

The present invention relates to network analysis instruments in general and specifically to network analysis instruments that measure scattering parameters (s-parameters) and more specifically to s-parameter measurement instruments using time domain methods and most specifically to methods of decreasing noise and therefore dynamic range in time domain network analysis.

BACKGROUND OF THE INVENTION

Network analyzers are instruments that characterize networks. The characterization result is based on conventions and define how the network will perform under various conditions. In signal integrity applications, the common network parameters in use are scattering parameters, or s-parameters. S-parameters define port to port relationships in a network when the network is driven by a source whose impedance is set to the reference impedance and all other ports are terminated in that same reference impedance. This convention allows scattering parameters to completely define the behavior of a network under any other driving and termination conditions.

A standard instrument for s-parameter measurement is the vector network analyzer (VNA). This instrument stimulates a network with sinusoidal incident wave-forms and measures the reflected sinusoidal waveforms at the network ports. This instrument is most commonly used in the field of microwave analysis. It is a very expensive instrument.

Another instrument used for s-parameter measurement uses techniques called time domain reflectometry (TDR) and time domain transmission (TDT) (Here we will use the commonly used acronym TDR to represent both techniques, the name of the instrument itself, and time domain analysis in general). TDR stimulates a network with an incident step, or pulse and measures reflected waveforms at the network ports. This instrument is most commonly used in the field of signal integrity. TDR is much less expensive than the VNA and has various advantages and disadvantages compared to the VNA.

Because of their cost, familiarity in the signal integrity field, and other reasons it is advantageous to measure s-parameters using time domain methods.

A well known drawback of time domain methods for s-parameter measurement is lack of dynamic range. While VNAs boast 90-110 decibels (dB) of dynamic range, it has been difficult to produce TDR instruments that can achieve much higher than 40 dB of dynamic range.

What is needed is a time domain s-parameter measurement instrument with higher dynamic range.

OBJECTS OF THE INVENTION

It is an object of this invention to provide methods for network analysis that provide high dynamic range.

It is a further object of this invention to provide methods and apparatuses that overcome the drawbacks to the prior art noted above.

Still other objects and advantages of the invention will in part be obvious and will in part be apparent from the specification and drawings.

SUMMARY OF THE INVENTION

FIG. 2 is an illustrative measurement example that is used as a context for summarizing the present invention. It shows conceptually a cable bundle [18] containing an internal transmission line [19] and another internal transmission line [20]. The equivalent signal flow diagram is shown below. All nodes labeled with a preceding "a" are ports where incident waves enter and all nodes labeled with a preceding "b" are where reflected waves exit. The "a" and "b" are followed by the port number. The complex weight of each arrow represent the s-parameters being measured. Each arrow goes from an incident wave entry node to a reflected wave exit node. The s-parameters are labeled S[n][m] corresponding to an arrow between node am and node bn. Some particular s-parameters which represent measurements of interest are indicated such as insertion loss [23], return loss or impedance [24], near end crosstalk (NEXT) [25] and far end crosstalk (FEXT) [26]. FEXT measurements are particularly illustrative because it is a measurement of the transmission between port 1 [21] and port 3 [22] which can be seen in FIG. 2 to be not connected ideally. FEXT is a sensitive measurement as the signal transfer from port 1 [21] to 3 [22] tends to be very small. To further enhance the example, consider a FEXT measurement of a twenty foot cable. It is illustrative because the device is electrically long requiring longer time domain waveforms, is lossy, and, as will be explained subsequently, involves considerable noise.

FIG. 3 depicts an example FEXT measurement. Here, one can see FEXT sitting above the noise floor [27] of about −10 to −30 dB below 5 GHz. Above 5 GHz, one sees only the measurement noise floor [28].

The inventors of the present invention have determined that the magnitude of this noise depends on several factors. To understand the source of this noise, consider the step [35] as is shown in FIG. 8 which depicts the waveform seen at port 3 [22] as a result of driving port 1 [21] with a 250 mV amplitude step waveform. This step [35] does not look too noisy visually. Consider however that we are interested in the signal to noise ratio (SNR), and the energy content of the step waveform is dropping rapidly with frequency. Furthermore, the amplitude of the step [35] is a mere 60 mV at most. It is useful to perform measurements on the difference of the step waveforms acquired. This normalizes the frequency content of the waveform and accentuates noise, but has no actual effect on SNR. The difference [30] is shown in the vicinity of the electrical length of the cable. Here we see that the information content is actually buried quite well in the noise.

The difference [30] frequency content [37] shows the noise spread over the entire region of interest from DC to 40 GHz which render traditional noise filtering methods useless.

Consider FIG. 1 which shows a process for removing significant amounts of noise in accordance with a preferred embodiment of the present method and invention. The goal is to generate a denoised raw s-parameter measurement [1] with the understanding that this represents a portion of the network analysis function that is followed by significantly more calculation that is traditionally performed in TDR and VNA instruments which utilize many such raw measurements. A single denoised raw s-parameter measurement [1] requires the step waveform that contains the step waveform acquired at the driven port [2] and at another or the same port [3]. Both waveforms require denoising with [3] requiring the most because of the length of the reflect portion. The denoising of the step [3] is explained in this summary with the understanding that step [2] undergoes the equivalent operation as shown in FIG. 1.

Step [3] first may undergo a difference operation [4] which approximates the derivative. Then, the discrete wavelet transform (DWT) [6] may be computed. The DWT has it's foundations in discoveries by Haar (see Haar A., Zur Theorie der orthogonalen Funktionensysteme, Mathematische Annalen, 69, pp 331-371, 1910) and is known to those skilled in the art of signal processing. The DWT first requires a choice of a wavelet. In a preferred embodiment, a Daubechie's wavelet, a wavelet determined by the number of coefficients in it's wavelet scaling function, is chosen. See Ingrid Daubechies, Ten Lectures on Wavelets, Society for Industrial and Applied Mathematics, 1992, ISBN 0-89871-274-2. A list of several wavelet coefficients are shown in FIG. 13 for reference. DWT [6] operates in accordance with the algorithm shown in FIG. 20 provided for reference. Prior to calculation of the DWT, the derivative waveform may be padded in the front with zeros to bring it to the next higher power of two.

Based on the wavelet chosen, the number of points, and the effect of the difference on noise shape, the shape of the noise may be calculated using the noise shape calculator [5]. As long as the wavelet coefficients and the number of points in the waveform remain constant, the noise shape needs calculation only once. The algorithm used by the noise shape calculator [5] is shown in FIG. 22.

Based on the wavelet chosen and the DWT calculated at the output of DWT [6], the noise in the DWT scales are estimated by the noise estimator [7]. The output of the noise estimator [7] may be used in conjunction with the output of the noise shape calculator [5] to produce a threshold [8]. The algorithm for estimating the noise and calculating this threshold is shown in FIG. 23. This threshold [8] in conjunction with the output of the DWT [6] may be used, in a preferred embodiment, in a hard threshold [9] operation whose algorithm is shown in FIG. 24. The result is a wavelet domain waveform with a significant amount of noise removed. While a hard threshold is described above, other appropriate threshold operations are possible including, but not limited to, soft thresholding and similar coefficient shrinkage techniques.

The result of the hard threshold [9] operation may then be transformed back to the time domain using the inverse discrete wavelet transform (IDWT) [10] in accordance with the algorithm shown in FIG. 21 provided for reference. The result of the IDWT [10] can optionally be supplied to the integrator [11] to provide a denoised version of the step waveform [3]. The result of the IDWT [10] may be supplied to the reflect extractor [12] which extracts the reflected waveform portion based on time location information in the input step waveform [3]. Note that [12] performs a nontrivial operation only if N=M (i.e. the step waveform [3] is the same as the driven step waveform [2]). The discrete Fourier transform (DFT) [13] thereafter may convert the result of the reflect extractor [12] to the frequency domain where the resulting complex vector forms the numerator [14] in the division operation [15] which divides by the denoised incident result which forms the denominator [16]. The result is the denoised raw s-parameter [1].

It is the result of the denoising block [17], in conjunction with the other various features described herein, that comprise a main subject of a preferred embodiment of the present invention. With regard to the example provided, the denoising block [17] preferably transforms the example waveform [30] which would appear at the output of difference operation [4] into the denoised difference waveform [31] which has significant noise removed [36] while retaining key waveform features that measure the crosstalk. The noise removed [36] and its representation in the frequency domain [39] shows that the noise is homogeneous in the region of the key signal features and that the noise removed is spread over the entire frequency spectrum of interest. The frequency content of the resulting denoised waveform [38] shows that the frequency content extends well below the original noise floor, greatly improving the SNR of the measurement and therefore the dynamic range.

When all waveforms acquired for s-parameter measurement are denoised, the resulting FEXT calculated [29] in FIG. 4 may be contrasted with the FEXT calculated without application of the present invention in FIG. 3 to see the extreme improvement in measurement dynamic range that may be achieved in accordance with application of one or more embodiments of the present invention.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

BRIEF DESCRIPTION OF THE DRAWINGS

For a more complete understanding of the invention, reference is made to the following description and accompanying drawings, in which:

FIG. 13 is a list of wavelet scaling function coefficients provided for reference in accordance with an embodiment of the invention;

FIG. 20 depicts a prior art algorithm for calculating a discrete wavelet transform (DWT);

FIG. 21 depicts a prior art algorithm for performing an inverse discrete wavelet transform (IDWT);

FIG. 22 depicts an algorithm employed by a noise shape calculator in accordance with an embodiment of the invention;

FIG. 23 depicts an algorithm for estimating the noise and calculating a threshold in accordance with an embodiment of the invention; and FIG. 24 depicts an algorithm for a hard threshold calculation in accordance with an embodiment of the invention.

DETAILED DESCRIPTION OF THE PREFERRED EMBODIMENTS

Figure 1:
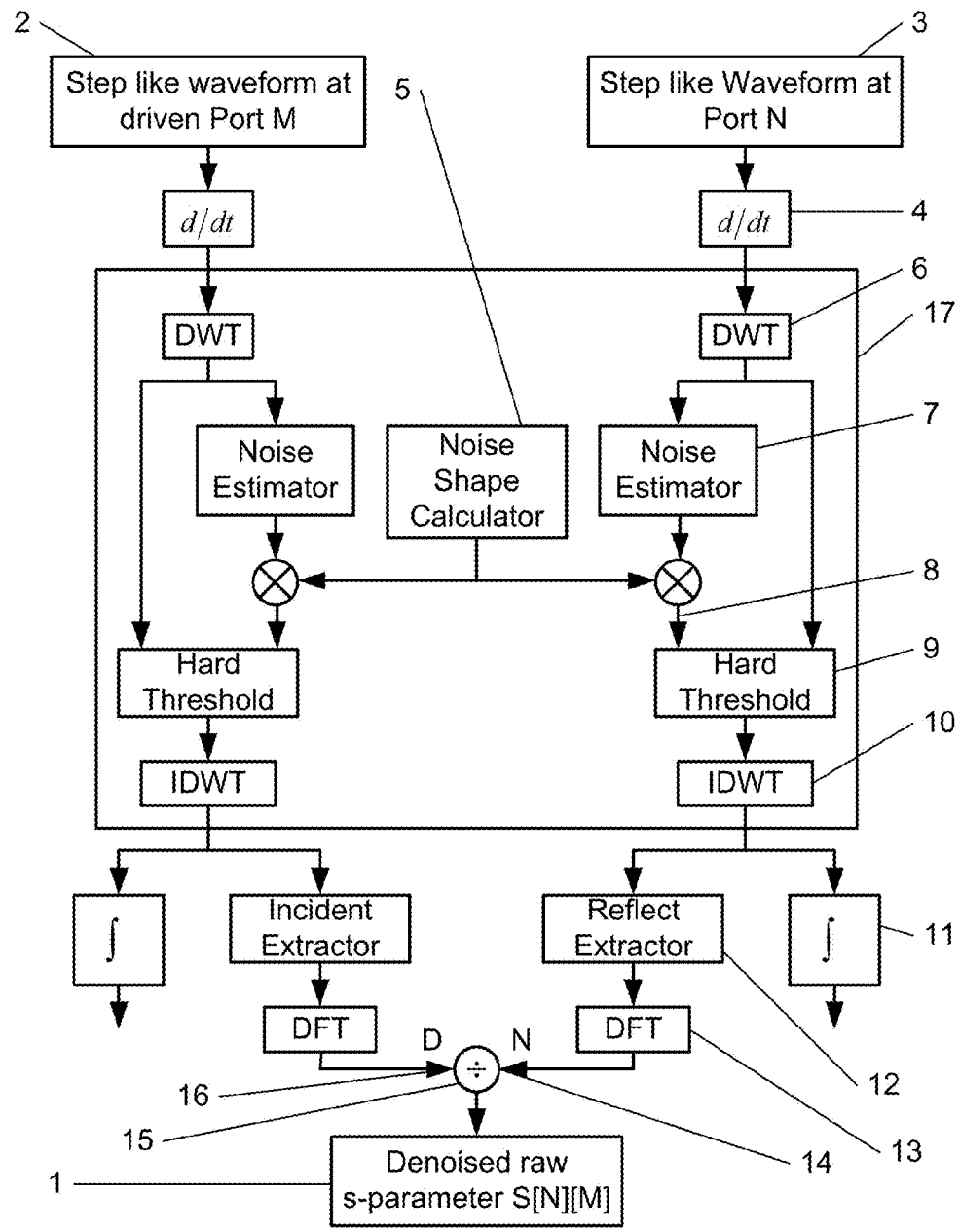
FIG. 1 is a block diagram showing wavelet denoising for s-parameter measurements in accordance with an embodiment of the present invention.
Figure 2:
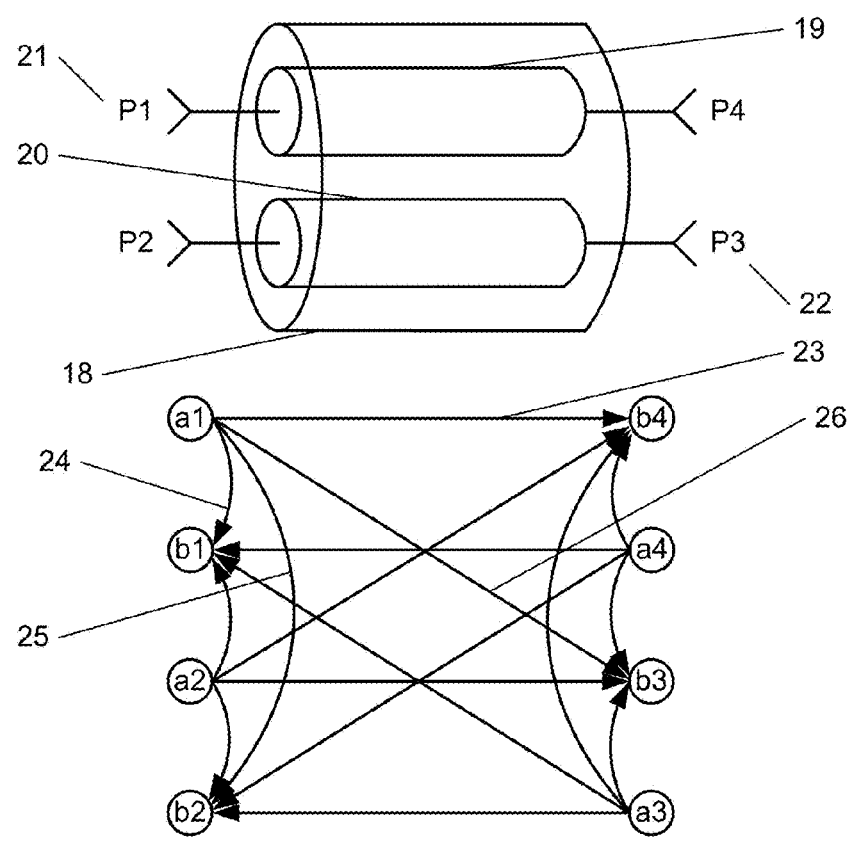
FIG. 2 is an example four port cable providing the context for a FEXT measurement.
Figure 3:
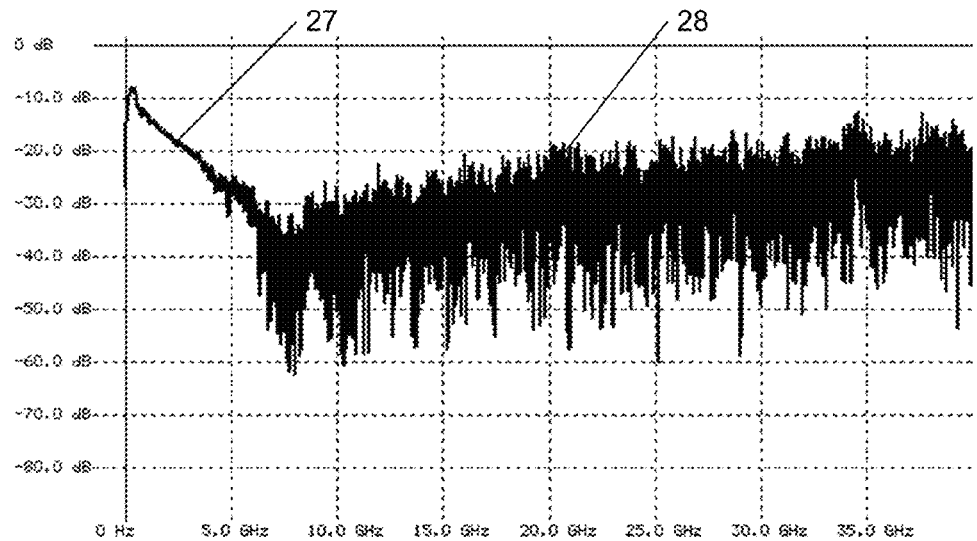
FIG. 3 is an example FEXT measurement without denoising.
Figure 4:
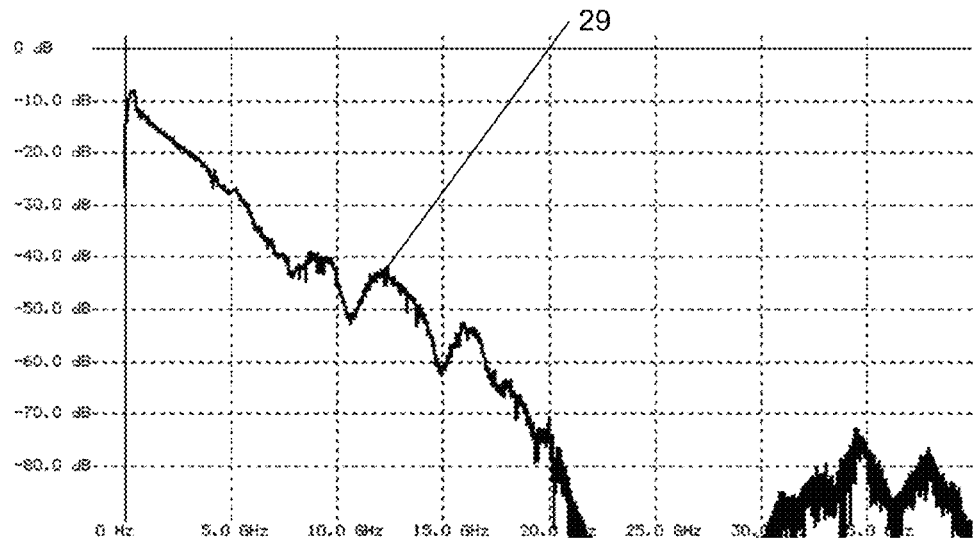
FIG. 4 is an example FEXT measurement with denoising applied according to one or more preferred embodiments of the present invention.

A detailed description of the invention will now be provided, making reference to the following drawings in which like reference numbers designate similar structure or steps.

In accordance with the invention, it can be shown that an expression for dynamic range in a time domain network analysis instrument is expressed as:

$$SNR_n = 10 \cdot \text{Log}\left(\frac{A^2 \cdot Fs_{eq} \cdot \text{avg}}{Ta \cdot f^2}\right) - N_{dBm} - C(f) + P(f) - 6 \quad (1)$$

In equation (1), A is the amplitude of an incident step waveform in Volts, $Fs_{eq}$ is the equivalent time sample rate in samples per second, avg is the number of averages taken, Ta is the length of the waveform in seconds, f is the frequency in Hertz, $N_{dBm}$ is the power of the assumed white noise in decibels relative to 1 mW delivered to a 50 Ohm load (dBm), C(f) is the attenuation of the cabling in dB as a function of frequency and P(f) is the response of the puller in dB as a function of frequency and is computed as the frequency content in the derivative of the step waveform. The dynamic range is a function of frequency, among other things. In equation (1), the number of averages taken may comprise a variable. A more useful expression considering the speed of the acquisition system is to consider the amount of time to wait. The number of averages taken in a given period of time is given by equation (2):

$$\text{avg} = \frac{Fs_{act} \cdot T}{Ta \cdot Fs_{eq}} \quad (2)$$

In equation (2), $Fs_{act}$ is the actual sample rate of the sampling system in samples per second and T is the amount of time to wait in seconds.

Substituting equation (2) in equation (1) yields equation (3):

$$SNR_n = 10 \cdot \text{Log}\left(\frac{A^2 \cdot Fs_{act} \cdot T}{Ta^2 \cdot f^2}\right) - N_{dBm} - C(f) + P(f) - 6 \quad (3)$$

Equation (3) states that the dynamic range goes down at 20 dB per decade of frequency which is a function of the incident waveform being a step and can be overcome to some extent by P(f). To have high dynamic range, one wants to have a large step amplitude, a high sample rate, a large amount of time, short waveforms, low intrinsic noise, and low cable losses. Many of these parameters have a variety of constraints that work against providing a wide dynamic range.

With regard to the various embodiments of the present method and invention, Ta is of particular interest. Dynamic range is dependent so strongly on Ta for two reasons. One is that longer waveforms take longer to acquire and therefore take more time per average. That cannot be helped. But another reason has to do with aspects that are particularly troublesome for time domain measurement instruments.

In time domain measurement instruments, the energy content of a signal is very concentrated in time. The incident edge rises over a very narrow time frame (a few picoseconds in high speed instruments). Measured reflected and transmitted edges also generally occur over very narrow time frames. The problem is that the measurement instrument must generally acquire the waveform in the time between the incident and reflected or transmitted edges and herein lies the problem. During the acquisition where no signal is present, the system is only acquiring noise, and the longer the waveform is, the more noise. Unfortunately, the length of the waveform is a function of the device under test (DUT). Longer devices require longer time.

Another problem regards the signal itself. Since the energy of the signal can be thought to be contained in the derivative, it is spread over the entire frequency range of the measurement simultaneously. This means that the noise cannot be filtered out in a traditional sense as filtering in a traditional sense implies that there are frequencies at which there is no signal and only noise and therefore can be removed.

Note further that $Fs_{eq}$ appears in equation (1), as higher equivalent time sample rates tend to increase the Nyquist rate which spreads more noise into frequencies that are not used and can therefore be filtered out. But note further that the equivalent time sample rate has disappeared in equation (3) (which was the point of showing the equations this way) because higher equivalent time sample rates result in more samples per waveform (for an equivalent Ta) which result in longer times to wait which results in less averages. In fact, the benefit of 3 dB increase per doubling of sample rate is lost in a 3 dB decrease due to halving the number of averages that can be taken in a given time. In summary, as has been determined by the inventors of the present invention, noise spreading through higher equivalent time sample rates followed by filtering is an ineffective proposition.

Figure 5:
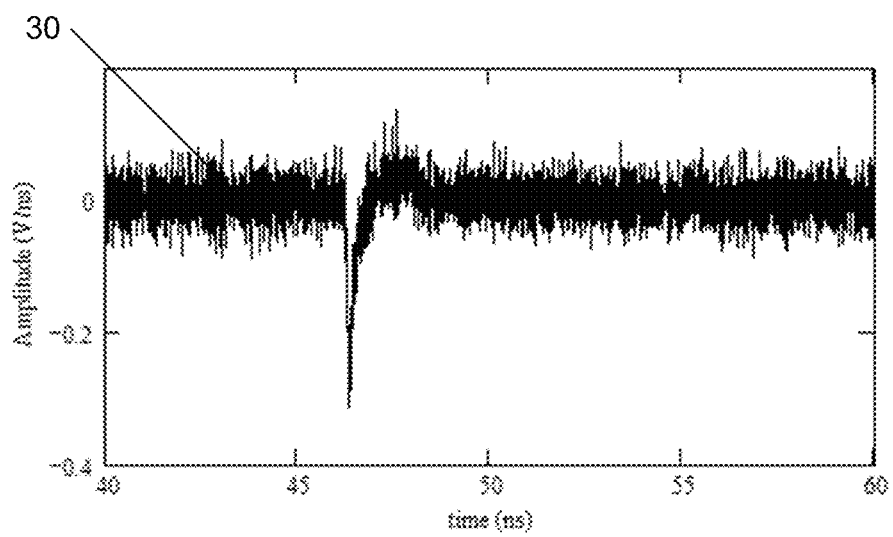
FIG. 5 is an example difference of a step waveform without denoising.
Figure 6:
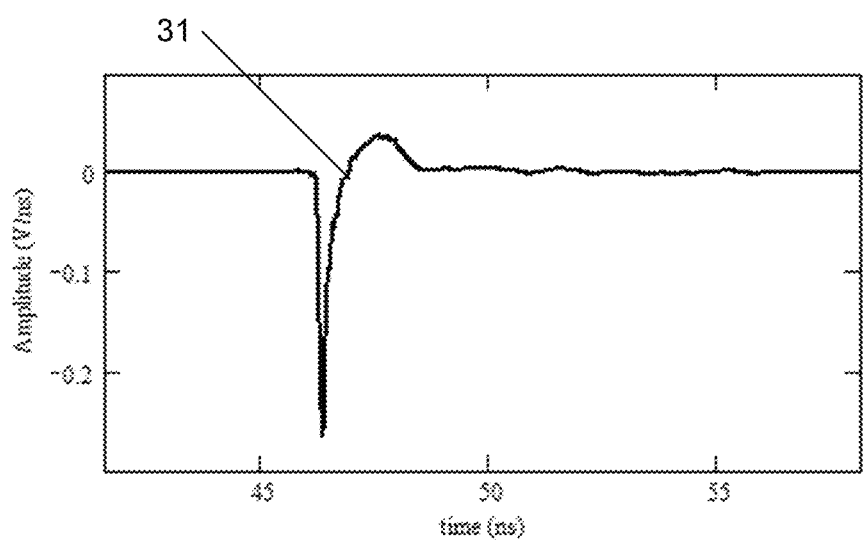
FIG. 6 is a denoised example difference waveform generated in accordance with an embodiment of the present invention.
Figure 7:
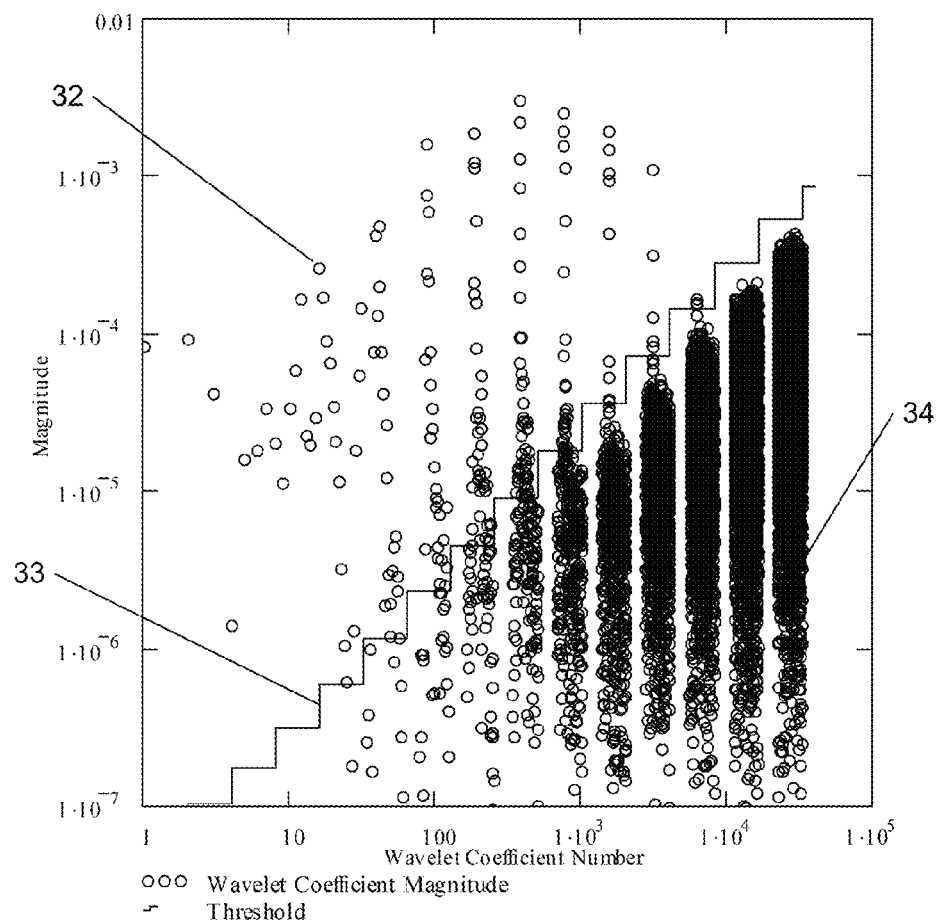
FIG. 7 is an example wavelet coefficients with the determined hard threshold value generated according to one or more embodiments of the present invention.
Figure 8:
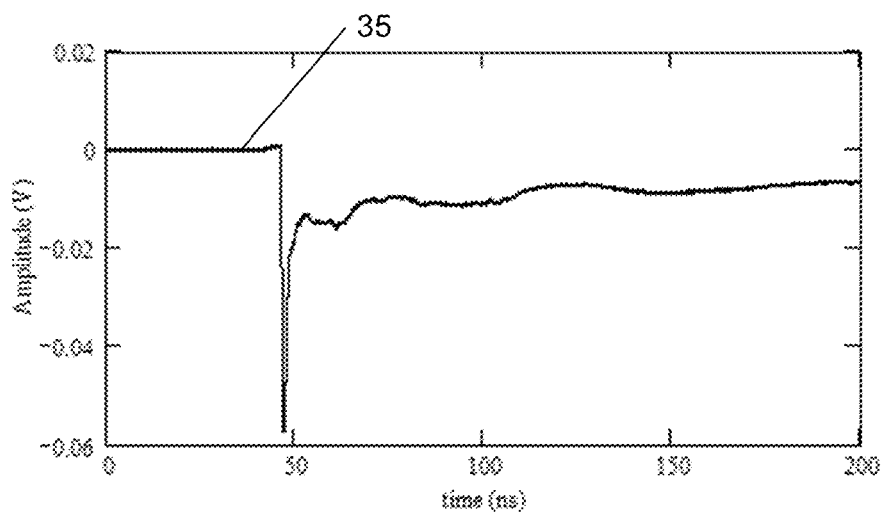
FIG. 8 is an example step waveform without denoising.
Figure 9:
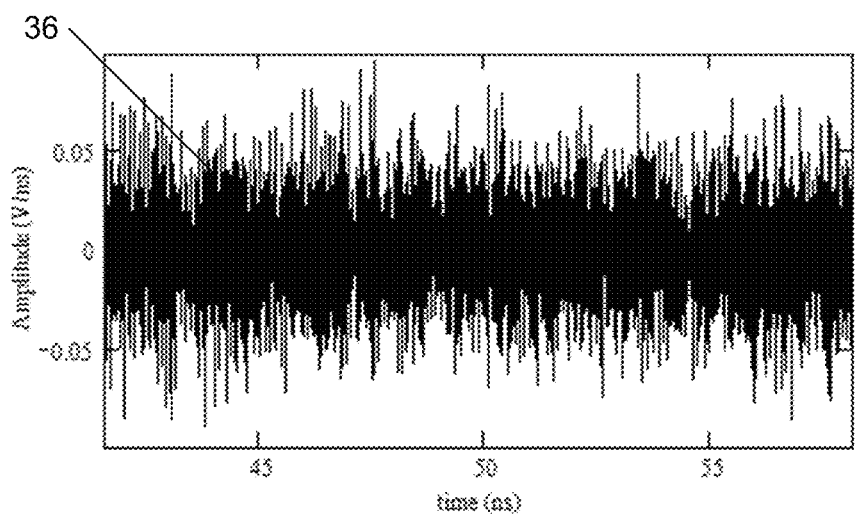
FIG. 9 is a representation of noise removed from an example difference waveform with denoising applied according to one or more embodiments of the present invention.
Figure 10:
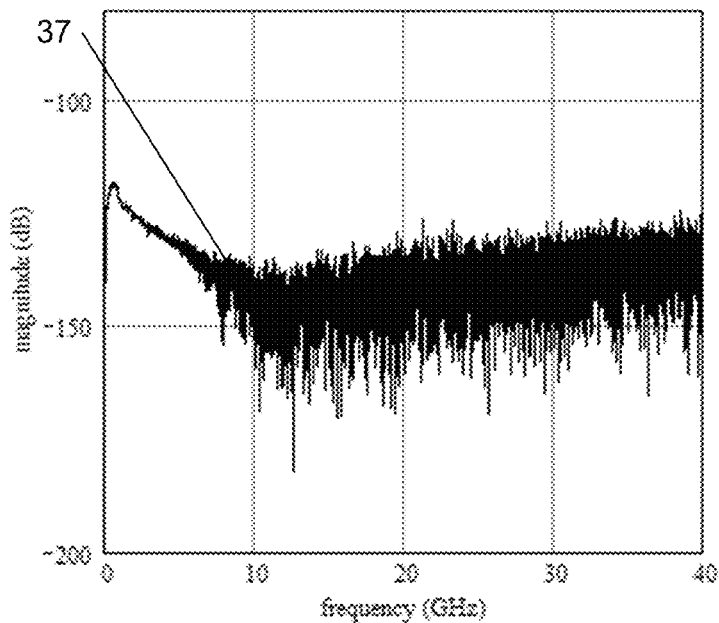
FIG. 10 is a frequency domain representation of the example difference waveform without denoising.
Figure 11:
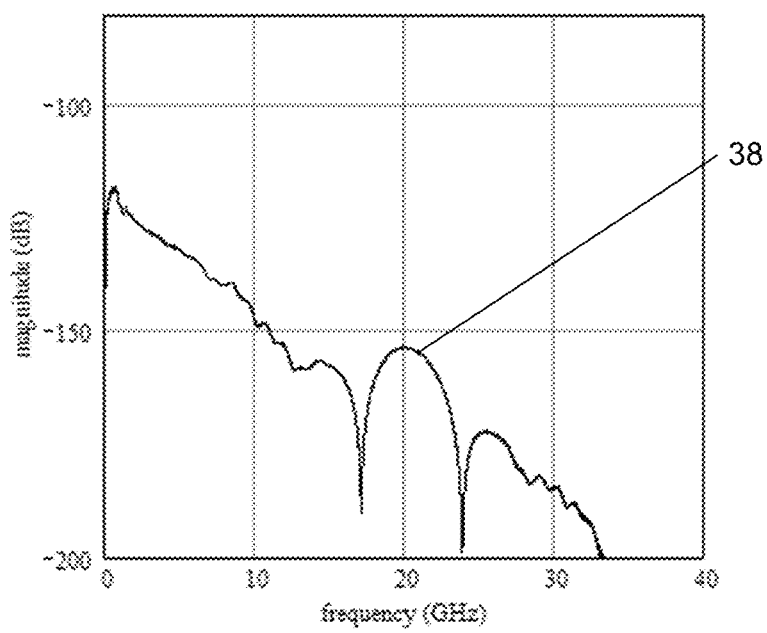
FIG. 11 is a frequency domain representation of an example denoised difference waveform provided in accordance with an embodiment of the present invention.
Figure 12:
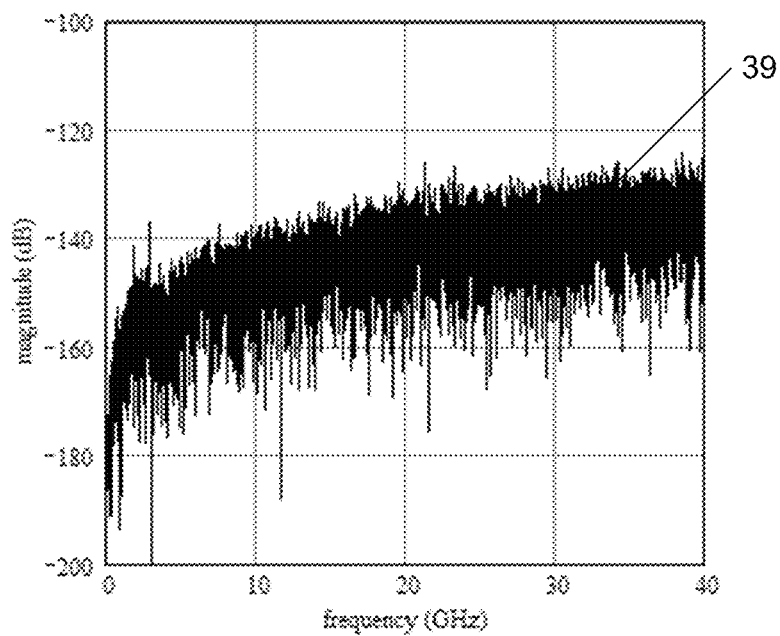
FIG. 12 is a frequency domain representation of the noise removed from the example difference waveform in accordance with an embodiment of the invention.

To understand conceptually the goal of the present method and invention, consider a system that can diminish the effect of Ta by removing at least the noise acquired in between reflections and transmitted signal portions of a waveform. For example, FIG. 8 shows an acquisition that is 200 ns in duration, while FIG. 5 shows that the largest energy content might be over about 2 ns at most. If one were only to remove the noise outside the region from 46 to 48 ns, the effective value of Ta would be only 2 ns with regard to the portion that effects dynamic range due to noise acquisition effects (the portion of Ta that pertained to the length of the waveform affecting the time it takes to acquire would still remain). But this reduction in noise is shown in equation (4):

$$SNR_{increase} = 10 \cdot Log\left(\frac{Ta}{Ta_{eff}}\right) \quad (4)$$

In the example being considered, just the reduction of the effective Ta value to 2 out of 200 ns in accordance with proposed embodiments of the invention is a 20 dB improvement in signal to noise, which is a huge improvement.

Note that a VNA which uses swept sine waves does not need to consider this situation because dynamic range is unaffected by the length of the (virtual) waveform. This is because the incident signal is present at all times, so increasing the length of time increases the amount of noise and signal simultaneously resulting in no degradation. And, by applying a single frequency at a time, it benefits, again in a virtual sense, by filtering that occurs by looking at a single frequency at a time.

Since signal is present over all frequencies of interest in time domain network analysis, a method of separation of the noise from the signal is needed. This is where the inventive concept of wavelets come in.

Therefore, in accordance with the invention, Wavelets, in a loose sense, are simply another set of basis functions used to describe a waveform. Just as the DFT decomposes a waveform into a set of complex coefficients that describe the magnitude and phase of its sine wave basis functions, the inventive DWT decomposes a waveform into a set of real valued coefficients that describe the amplitude of its wavelet basis functions that make up the waveform. Wavelets have both frequency and time information. The frequency information is contained in the scale that a wavelet is located in, and the time information is contained in the coefficient index within such a scale.

Just as using the derivative of step like waveforms is advantageous for the DFT since it enforces continuity at the waveform edges, the same is true for the DWT as it is generally assumed to repeat in time like the DFT.

To utilize the DWT for denoising in accordance with various embodiments of the invention, the derivative waveform may be decomposed into its wavelet coefficients using the algorithm shown in FIG. 20. The algorithm in FIG. 20 is prior art and found in the public domain from various sources and is provided here only because there are a variety of ways of calculating the DWT depending on the type of wavelet used. In a preferred embodiment, Daubechie's wavelets are used which are orthogonal and orthonormal basis functions defined only by the filter functions used to separate the scales. Similarly, as the IDWT must be the appropriate inverse such that x=IDWT (DWT(x)), this algorithm is shown in FIG. 21 which is also prior art found from a number of sources.

Of primary concern in the application of the inventive denoising operation is the choice of the threshold. The threshold determination involves two steps. First, the uncorrelated noise statistics should be determined. Second, the shape of the noise may to be computed.

The noise shape will now be addressed first. Consider a K point sequence of normally distributed white random noise with a mean of 0 as $\epsilon$, where each point $\epsilon_k$, k$\epsilon$0 . . . K−1 represents a single point in the sequence. The amount of noise is described by the standard deviation which is the same as the root mean squared (rms) value when the mean is zero as in equation (5):

$$\sigma = \sqrt{\frac{1}{K}\sum_k \epsilon_k^2} \quad (5)$$

The frequency content is then determined by computing the discrete Fourier transform of this sequence and determining the rms value at each frequency bin E, which yields N=K/2 points, where each frequency point $E_n$, n$\epsilon$0 . . . N reflects the rms noise at each frequency bin. In equation (5), the noise was computed in the time domain. It can also be computed in the frequency domain as equation (6):

$$\sigma = \sqrt{\sum_n |E_n|^2} \quad (6)$$

Since the noise is white, $E_n$ has an expected value as of shown in equation (7):

$$\overline{E_n} = \frac{\sigma}{\sqrt{N}} \quad (7)$$

In equation (7), each frequency point $f_n$ is defined as in equation (8), where Fs is the sample rate:

$$f_n = \frac{n}{N}\frac{F_s}{2} \quad (8)$$

Often noise is not white, but is shaped in the frequency domain. Consider a shape to the noise described in the frequency domain as $H_n$, which can be considered as a filter that modifies the noise such that noise is calculated as:

$$\sigma_s = \frac{\sigma}{\sqrt{N}}\sqrt{\sum_n |H_n|^2}$$

Figure 14:
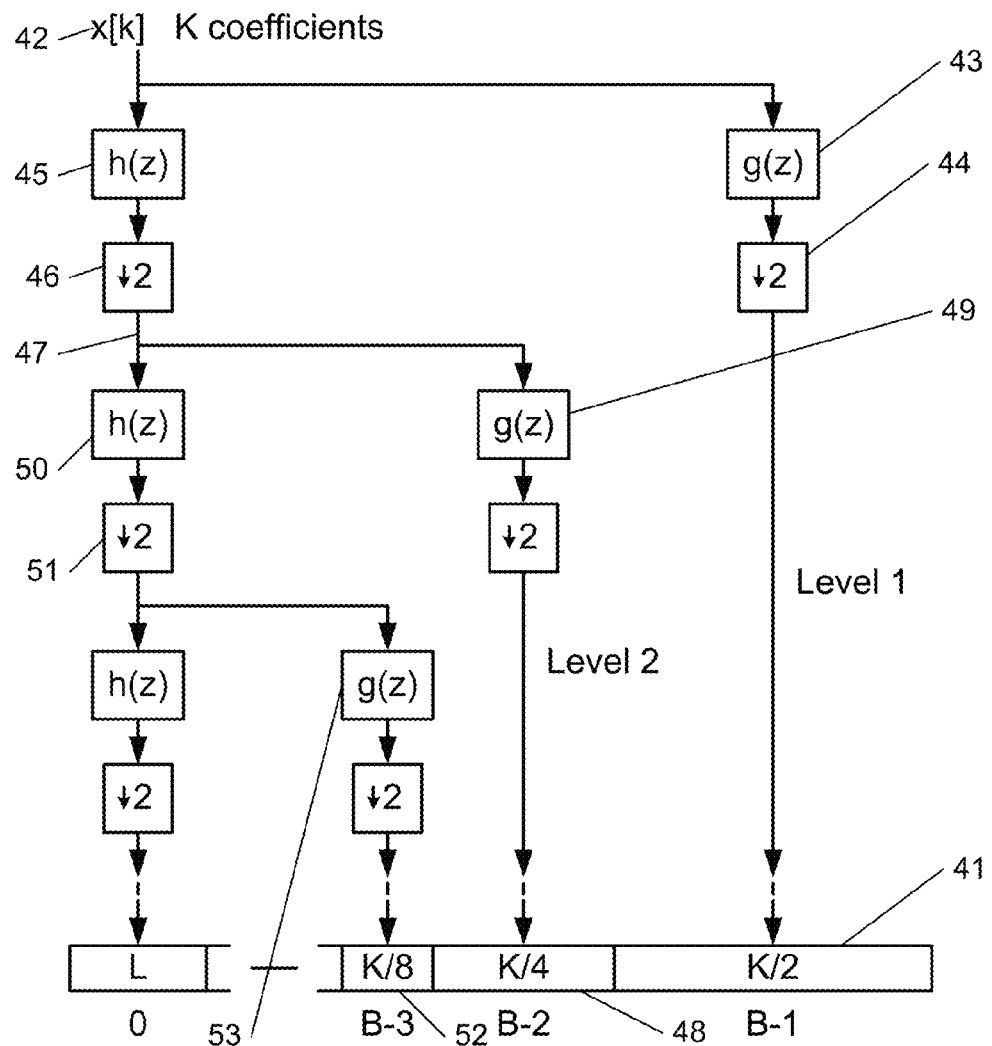
FIG. 14 is a block diagram of a wavelet transform operation in accordance with an embodiment of the invention.

The threshold determination for wavelet denoising may first consider the relationship between the noise spectrum in the Fourier and wavelet domains. To begin, consider the wavelet transform process outlined in FIG. 14 adapted from Robi Polikar, "The Wavelet Tutorial", http://users.rowan.edu/~polikar/WAVELETS/WTtutorial.html. Here, the input signal is shown passing through various filters and decimators at various stages. Immediately, the input signal is shown passing through a filter defined as h(z) and g(z). In accordance with embodiments of the present invention, in wavelet transforms defined by scaling functions, the wavelet coefficients are the coefficients of the finite impulse response filter (FIR) h. h(z) is a low pass filter. g(z) is a QMF that is a high pass filter with the exact opposite characteristics of h(z). The low pass filter essentially passes most frequency content below ¼ the Nyquist rate and the high pass filter essentially retains most frequency content above ¼ the Nyquist rate. The level 1 coefficients [41] may be generated by passing the input signal X [42] through high pass filter g(z) [43] and decimating the result through a down sampler [44]. On the other side, the input signal X [42] through low pass filter h(z) [45] and is decimated through a down sampler [46]. This portion of the signal [47] is now prepared for the generation of the Level 2 Coefficients [48] and the process continues until desired or until the signal cannot be decimated and filtered any more. A notation comment is in order. When computing the DWT, the result is a K point vector. The last set of coefficients [41] consist of the K/2 points of detail information for the last scale. If there are B scales, this is for scale numbered B−1. Each scale has a portion of the input noise shaped in a way that is affected by the wavelet transform process.

In accordance with an example exemplifying embodiments of the invention, consider an input noise signal shaped like H where $H_n$ is a filter response that describes the noise shape for a given frequency $f_n$ as given by equation (8). For the level 1 coefficients in scale B−1, the high-pass filter applied during the wavelet transform generates a noise shape at the output of the high pass filter [43] and prior to decimation as equation (9):

$$H1_n = H_n \left| g\left(e^{j\pi \frac{n}{N}}\right) \right| \quad (9)$$

Equation (9) is the noise shaped by the high pass filter. The noise shape at the output of the low pass filter [45] and prior to decimation is defined by equation (10):

$$H_n = H_n \left| h\left(e^{j\pi \frac{n}{N}}\right) \right| \quad (10)$$

Note that equation (10) shows the input noise shape modified. This is because determining the noise shape is an iterative process. Now, because a decimation occurs at [46], the noise shape is modified for n∈0 . . . N/2 as shown in equation (11):

$$H_n = \sqrt{|H_n|^2 + |H_{N-n}|^2} \quad (11)$$

Equation (11) accounts for the folding effect created by down sampler [46], after which N may be modified as N=N/2. The process continues with the noise in H modified again by high pass filter [49] in the generation of the level 2 coefficients [48] and modified by low pass filter [50] and down sampler [51] in preparation for level 3 coefficient generation [52], etc.

Therefore, one can see that the distribution of noise in each scale in the wavelet domain can be determined given the spectral distribution of noise in the frequency domain. Furthermore, knowing the noise distribution in the wavelet domain, the total noise in each wavelet scale can be computed by summing the noise using the equivalence given by equation (6).

Figure 15:
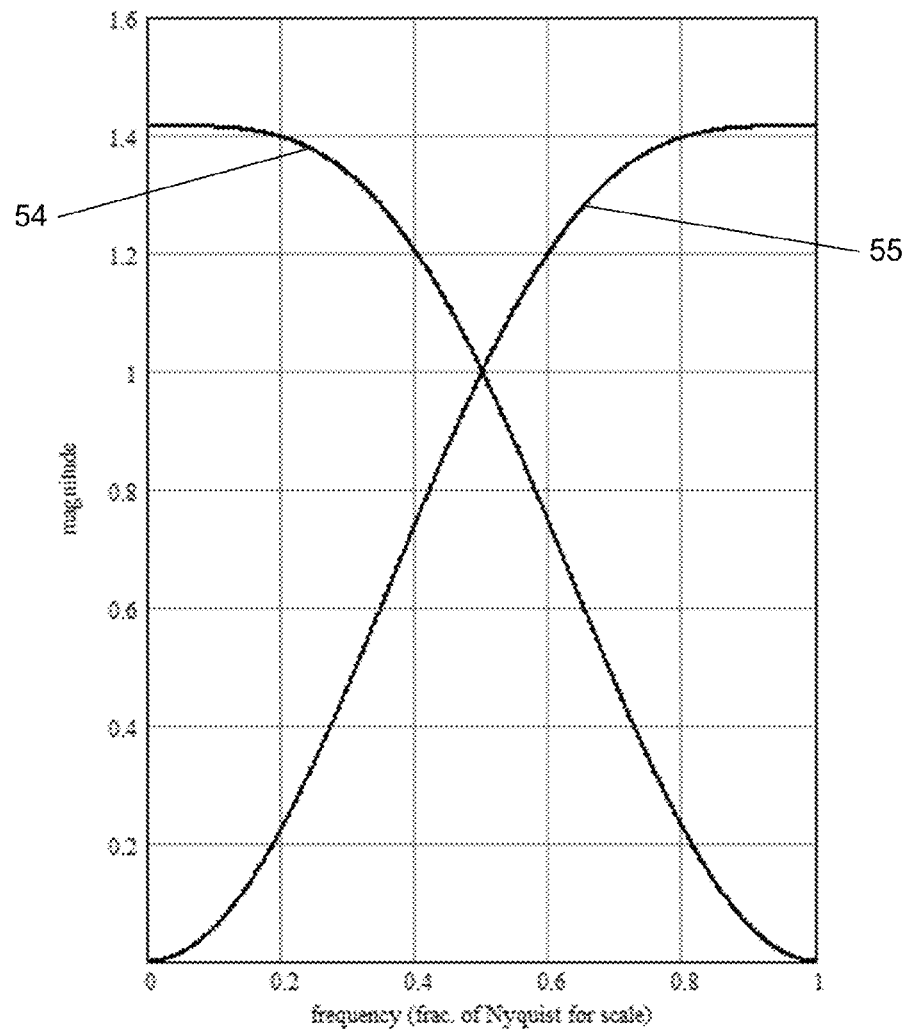
FIG. 15 is a filter responses of the wavelet low pass filter function and the quadrature mirror filter (QMF) high pass filter function of a Daubechie's 4 tap wavelet in accordance with an embodiment of the present invention.
Figure 16:
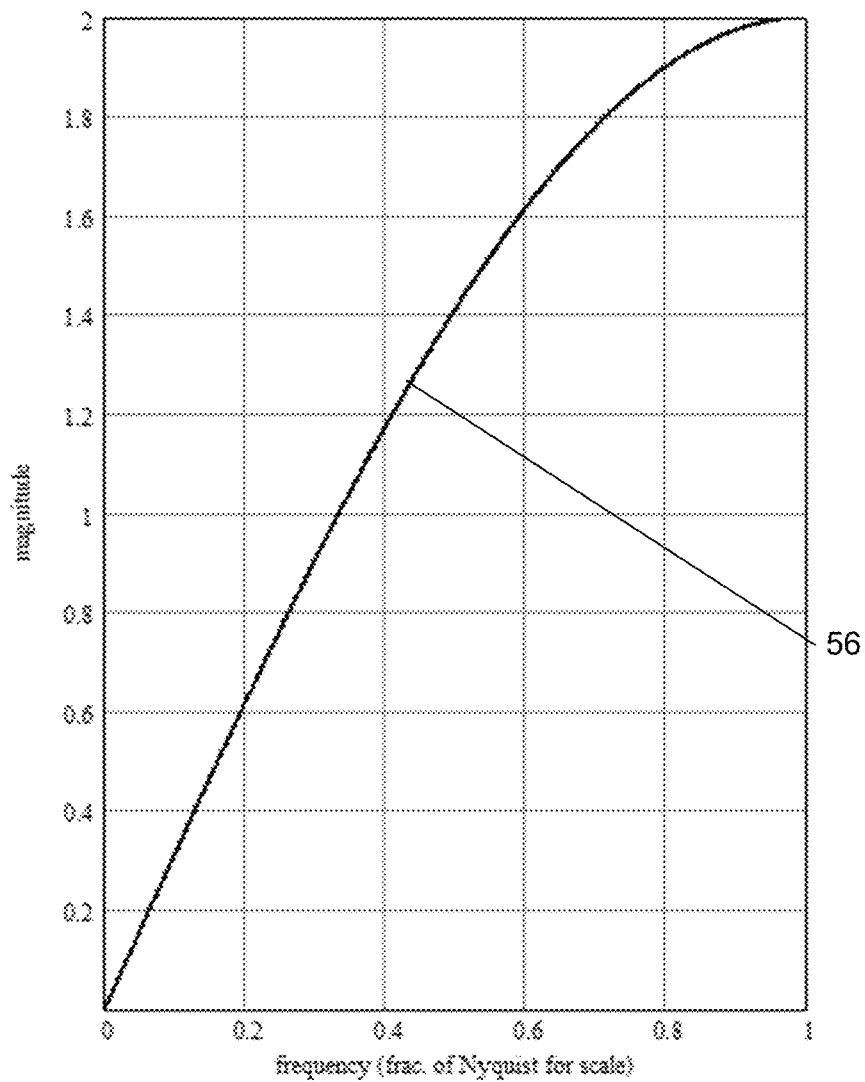
FIG. 16 is a noise shape effect of the difference operation presented in the frequency domain in accordance with an embodiment of the invention.
Figure 17:
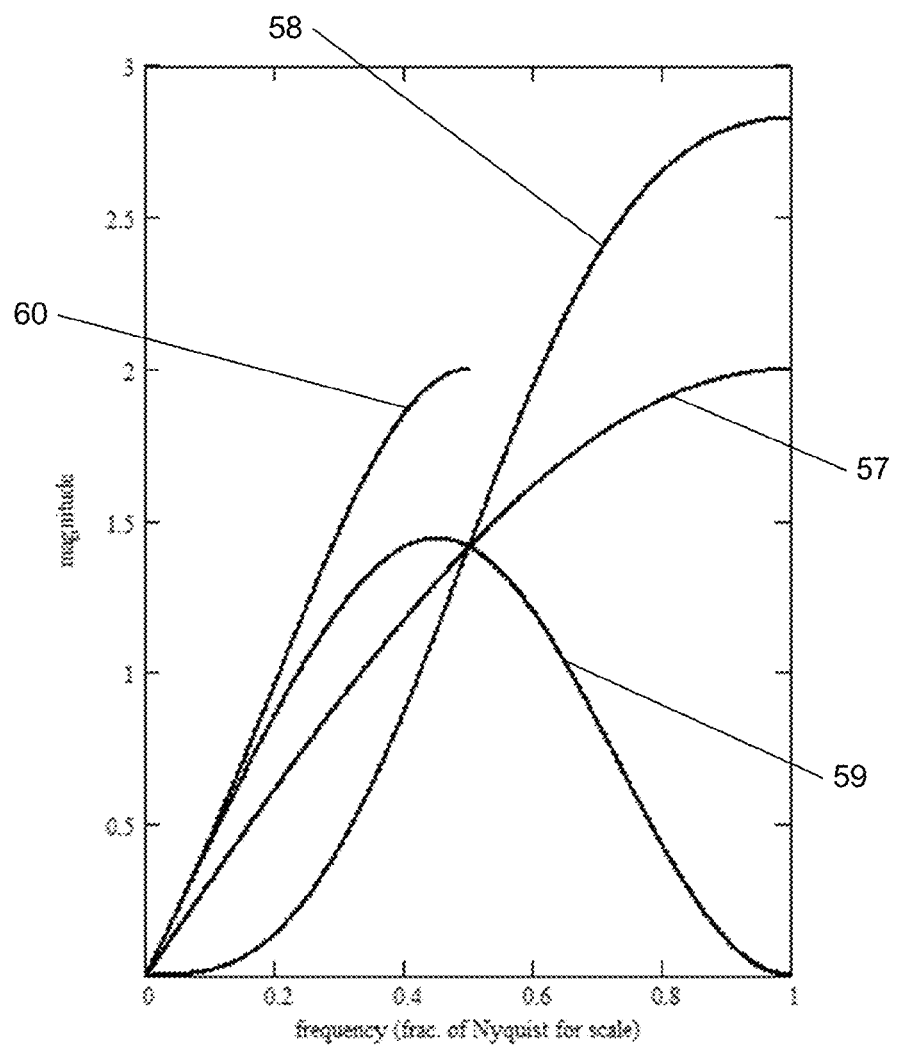
FIG. 17 illustrates the effect of the wavelet transform on level 1 coefficients in accordance with an embodiment of the invention.
Figure 18:
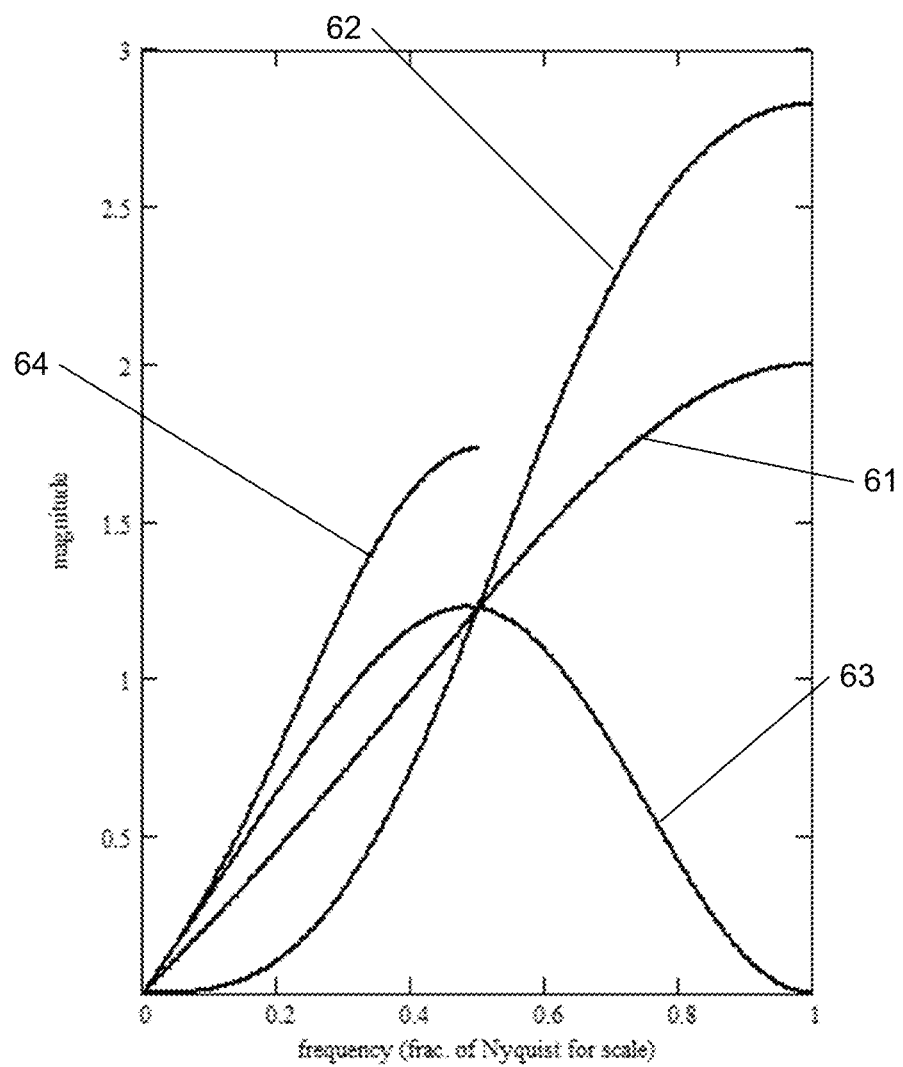
FIG. 18 illustrates the effect of the wavelet transform on level 2 coefficients in accordance with an embodiment of the invention.

As an example employing embodiments of the present invention, consider the noise distribution shape [56] shown in FIG. 16. It happens to be the noise distribution caused by the difference as will be discussed subsequently. FIG. 15 shows the filter responses corresponding to Daubechie's 4-tap wavelet whose coefficients [40] define a low pass filter response [54] and a corresponding high pass filter response [55]. Low pass filter response [54] and high pass filter response [55] correspond to a possible responses of the filters with response h(z) and g(z) respectively in FIG. 14. FIG. 17 shows the reshaping of the noise in the level 1 coefficient determination. Here, [57] is the input shape [56]. Applying the high pass filter with response [55] results in a noise shape [58]. This is the noise shape in the level 1 coefficients, or the last scale. Applying the low pass filter with response [54] results in [59]. When down sampled, [59] folds back and adds to produce [60]. For the next level, [60] is shown in FIG. 18 as [61], which is now shown corresponding to the new Nyquist rate. Applying the high pass filter with response [55] results in [62]. This is the noise shape in the level 2 coefficients, or the next to last scale. Applying the low pass filter with response [54] results in [63]. When down sampled, [63] folds back and adds to produce [64] and the process continues.

Figure 19:
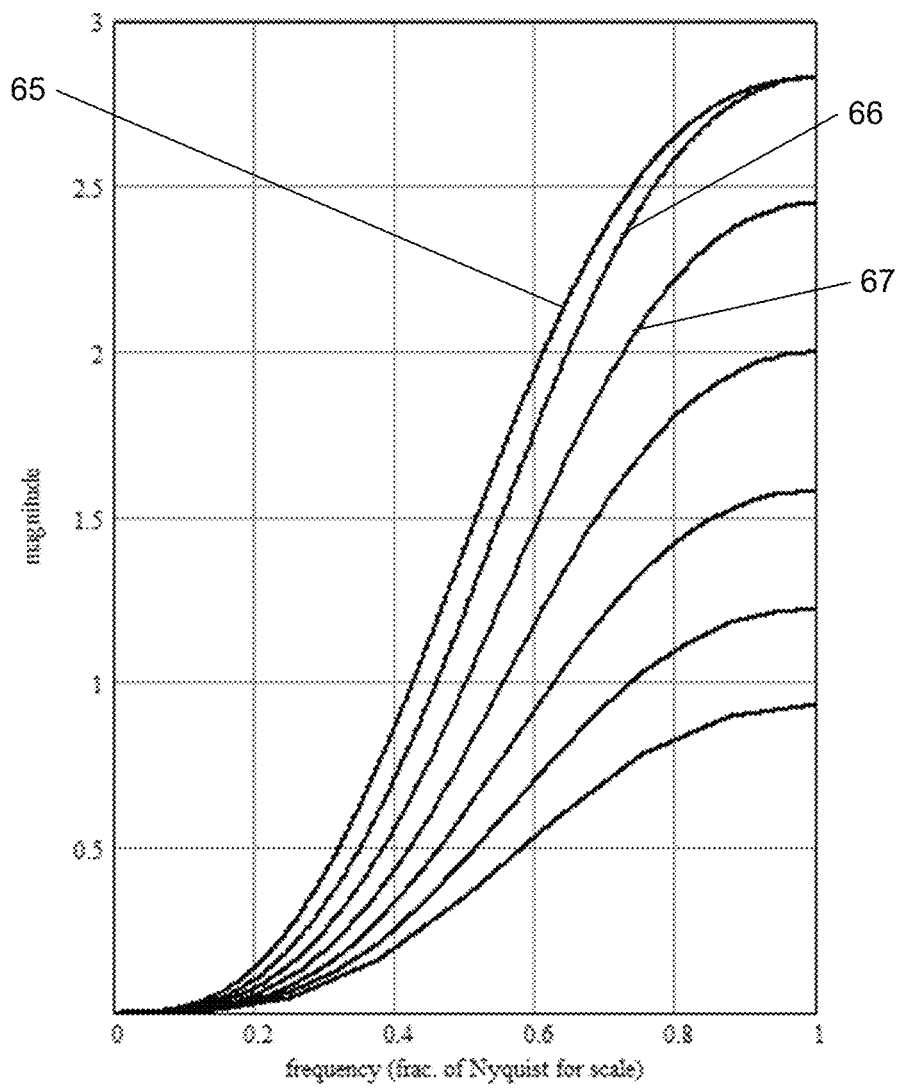
FIG. 19 illustrates a noise shape in an undecimated spectrum of each wavelet transform scale in accordance with an embodiment of the invention.

FIG. 19 exemplifies the spectral content at the output of the high pass filter in the generation of each scale, prior to decimation. [65] exemplifies the output of [43], [66] exemplifies the output of [49] and [67] exemplifies the output of [53]. The term "exemplifies" is used because the exact shape depends on the wavelet type used.

An algorithm in accordance with embodiments of the invention for determining the noise statistics in each wavelet scale is shown in FIG. 22. [68] is a function that takes N+1 points of noise shape in E. E is assumed to be the resulting spectral distribution resulting from taking the DFT of a K=2N point noise waveform. h is the L element vector of wavelet scaling filter coefficients. The wavelet coefficient vector length and the noise signal length determines the number of scales B in the DWT of the K point noise signal shown at [69]. For each scale (in reverse order) [70], first the noise in the scale is determined by applying the high pass wavelet function filter function to the remaining noise distribution [71] and then for each frequency point that will remain in the half spectrum resulting from applying the low pass wavelet function filter and down sampling by a factor of 2 [72], the remaining noise shape to pass on the next level is calculated [73] and the frequency points are halved [74]. Once all scales have been exhausted, the last scale is filled in with any residual noise [75] and the vector of noise statistics for each scale is returned [76].

While FIG. 22 can be used to determine the noise statistics in each wavelet scale using any spectral noise distribution, for the purposes of wavelet denoising for time domain network analysis in accordance with embodiments of the present invention, there is a particular noise distribution of interest. As mentioned previously, time domain network analysis is achieved by applying step like waveforms to a system and acquiring the step like response. The step is discontinuous at the waveform edges and does not lend itself well to analysis using the DFT or the DWT which assumes repeating waveforms. Various methods have been created to deal with these analysis problems as far as the DFT is concerned, such as W. L. Gans & N. S. Nahman, "Continuous and discrete Fourier transform of step-like waveforms", IEEE Trans. Inst. & Meas., vol. IM-31, pp. 97-101, June 1982 and A. M. Nicolson, "Forming the fast Fourier transform of a step response in time-domain metrology", Electron. Lett., vol. 9, pp. 317-318, July 1973. The inventors have determined that these problems can be sidestepped by simply operating on the difference of the waveforms acquired, which has the effect of normalizing the frequency content of the step and the effect of simultaneous amplification of noise, especially high frequency noise, but in fact has no actual effect on SNR and therefore the dynamic range. Furthermore, where denoising is concerned, the inventor has further determined that it is advantageous to utilize the DWT, which, in common implementations, has the similar characteristic as the DFT in that it assumes that waveform sequences repeat. This characteristic causes problems in that the step like waveform is discontinuous and the DWT will produce wavelets to deal with the discontinuity. Instead, whether one wants to recover the denoised step like waveform or chooses to utilize the difference waveform, it is advantageous to perform the denoising operation on the difference waveform. When the difference waveform is utilized, however, the reshaping of the noise spectrum must be dealt with in utilizing wavelet denoising techniques.

Considering the original noise signal $\epsilon_k$ whose noise statistics are known as in equation (5) and whose noise distribution in the frequency domain is given by equation (7). The difference may be calculated as equation (12):

$$d\epsilon_k = \epsilon_k - \epsilon_{k-1} \quad (12)$$

The distribution in the frequency domain is therefore given by equation (13):

$$|\overline{DE_n}| = \frac{\sigma}{\sqrt{N}}|1 - e^{j\pi \frac{n}{N}}| = \frac{\sigma}{\sqrt{N}}\sqrt{2\left(1 - \cos\left(\pi \frac{n}{N}\right)\right)} \quad (13)$$

Equation (13) shows that the noise in each spectral bin is now the original expected value of the noise $\sigma/\sqrt{N}$ shaped by a shaping function. The shaping function is plotted as [56] in FIG. 16.

FIG. 23 shows an algorithm in accordance with an embodiment of the invention for determining the correct threshold for the difference waveform to be denoised. Here, we have a function [77] that takes the K point waveform X that is assumed to be the DWT of the difference waveform to be denoised along with the L coefficient wavelet used. Since the waveform has K wavelet domain elements, and therefore time domain elements, the number of frequency bins in the DFT are calculated [78] along with the number of scales [79] in the DWT. For each bin [80], the noise shape function is computed [81]. From this noise shape function, the shape of the noise in the wavelet scales [82] is calculated.

In a preferred embodiment of the invention, statistics of noise in the original waveform may be computed directly from the DWT using certain criteria that are enforced. The first condition is that the waveform acquired is preferably sufficiently sampled and preferably oversampled by a factor of 2. Sufficiently sampled means that the Nyquist rate (the sample rate divided by two) is higher than the highest frequency content present in the actual signal and oversampled by a factor of 2 means the Nyquist rate is actually twice higher. These conditions are never perfectly and strictly met, but the goal is that the latter half of the spectrum contains only noise. Sufficiency of sample rate is easy to enforce because the system would not work well otherwise. The second condition is that there is no signal present in the latter portion of the waveform. This condition is easily met because in time domain network analysis, the waveforms must be long enough that signal dies out before the end anyway. The final condition is that the noise is white. This is sometimes the case and sometimes not and can easily be worked around as shown if the actual shape of the spectrum is known.

Based on the conditions presented, the end of the wavelet transform waveform X preferably contains mostly noise shaped by the difference function. Therefore an index P may be computed [83] representing a percentage of the end of the last scale whereby from index K−P to K−1 first the mean value [84] and then the standard deviation [85] is calculated. As described above, one can estimate the noise in the input signal [86]. Given the statistics of the input signal σ, the number of frequency points N and the noise shape in the DWT TS a threshold function may be computed. For each point in the DWT [87], the wavelet transform scale b corresponding to the wavelet transform coefficient may be computed [88], the threshold value for that coefficient is computed [89] and the vector of these results are returned [90]. Note that this threshold function is such that if the DWT X provided contained only the difference of a waveform whose noise is white and whose rms value is σ, then th is an estimate of the standard deviation of the wavelet coefficients of X. In other words, 68.2% of the wavelet coefficient magnitudes would fall below this threshold.

Now that a method of computing the statistics of the noise in the difference waveform in accordance with an embodiment of the invention has been shown, an efficient and effective method for denoising the difference waveforms computed from the waveforms acquired during time domain network analysis measurements in accordance with a further embodiment of the invention is shown in FIG. 24 which utilizes, in a preferred embodiment, a hard thresholding algorithm for removing noise. The function [91] takes the K point difference waveform x along with the preferred wavelet coefficients h. The DWT is first computed [92] and the result is utilized to compute the appropriate threshold [93] for each coefficient. Note here that a factor of 5 has been applied to the threshold calculation to set a threshold that is five standard deviations of the noise in the coefficient. This means that if x provided were only the difference of a waveform whose noise is white and whose rms value is σ, approximately one in two million coefficients would contain a value whose magnitude was above this threshold. To apply this threshold, the number of points in the waveform is computed [94] and for each point [95], the magnitude of the DWT coefficients are compared to this threshold [96]. If the magnitude falls below the threshold, the coefficient in the denoised DWT is set to zero [97], otherwise it is retained [98]. Once the threshold operation is complete, the IDWT is computed [99] and returned [100].

It has been shown in the summary that when waveforms are processed in the manner shown, significant amounts of noise are removed and the resulting s-parameter measurements exhibit a significant improvement in dynamic range.

It will thus be seen that the objects set forth above, among those made apparent from the preceding description, are efficiently attained and, because certain changes may be made in carrying out the above method and in the construction(s) set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed:

1. A method for producing a denoised output waveform from a noisy waveform by a time domain measurement instrument running a computer program stored to a non-transitory computer readable storage medium associated therewith, the computer program causing the time domain measurement instrument to perform the steps of:

providing the noisy waveform as an input waveform;

determining a frequency domain noise shape associated with the input waveform;

calculating a wavelet domain noise shape from the frequency domain noise shape;

calculating a discrete wavelet transform of the input waveform to form a wavelet domain waveform;

estimating the noise statistics from the wavelet domain waveform;

calculating a threshold from the estimated noise statistics and the wavelet domain noise shape;

applying the threshold to the wavelet domain waveform to form a denoised wavelet domain waveform; and calculating an inverse discrete wavelet transform of the denoised wavelet domain waveform to form a denoised waveform.

2. The method of claim 1, wherein the denoised waveform contains less noise than the noisy waveform.

3. The method of claim 1, wherein the calculation of the wavelet domain noise shape further comprises the steps of:

determining a filter response corresponding to wavelet coefficients associated with the discrete wavelet transform; and determining the effect of the application of the discrete wavelet transform to the frequency domain noise shape on each discrete wavelet transform coefficient comprising the wavelet domain waveform.

4. The method of claim 1, wherein the step of estimating the noise statistics from the wavelet domain waveform further comprises the steps of:

identifying a portion of the wavelet domain waveform; and calculating a standard deviation of the wavelet coefficients comprising the portion of the wavelet domain waveform.

5. The method of claim 1, wherein the method for producing a denoised output waveform from a noisy waveform is employed in accordance with a time-domain reflectometry measurement.

6. The method of claim 5, wherein the noisy waveform is a step like waveform at a driven port.

7. The method of claim 5, wherein the noisy waveform is a step like waveform at a port that is not driven.

8. A method for producing one or more denoised raw s-parameters from one or more noisy waveforms in accordance with a time-domain reflectometry measurement by a time domain measurement instrument running a computer program stored to a non-transitory computer readable storage medium associated therewith, the computer program causing the time domain measurement instrument to perform the steps of:

providing the one or more noisy waveforms received by the time domain measurement instrument as one or more input waveforms;

determining one or more frequency domain noise shapes associated with one or more of the one or more input waveforms;

calculating one or more wavelet domain noise shapes from the one or more frequency domain noise shapes;

calculating a discrete wavelet transform of each of the one or more input waveforms to form one or more wavelet domain waveforms;

estimating one or more noise statistics from the one or more wavelet domain waveforms;

calculating one or more thresholds from the one or more estimated noise statistics and the one or more wavelet domain noise shapes;

applying the one or more thresholds to the one or more wavelet domain waveforms to form one or more denoised wavelet domain waveforms;

calculating an inverse discrete wavelet transform of each of the one or more denoised wavelet domain waveforms to form one or more denoised waveforms;

extracting an incident portion of one or more of the one or more denoised waveforms to form one or more incident denoised waveforms;

extracting a reflect portion of one or more of the one or more denoised waveforms to form one or more reflect denoised waveforms;

computing the discrete Fourier transform of one or more of the one or more incident denoised waveforms to form one or more Fourier domain incident denoised waveforms;

computing the discrete Fourier transform of one or more of the one or more reflect denoised waveforms to form one or more Fourier domain reflect denoised waveforms;

computing the element by element ratio of one or more of the one or more Fourier domain reflect denoised waveforms to one or more of the one or more Fourier domain incident denoised waveforms to form one or more denoised raw s-parameters; and storing the one or more denoised raw s-parameters to the non-transitory computer readable storage medium.

9. The method of claim 8, wherein a measurement dynamic range is improved.

10. The method of claim 8, wherein the calculation of the one or more wavelet domain noise shapes further comprises the steps of:

determining one or more filter responses corresponding to wavelet coefficients associated with the one or more discrete wavelet transforms; and determining the one or more effects of the application of the one or more discrete wavelet transforms to the one or more frequency domain noise shapes on each discrete wavelet transform coefficient comprising one or more of the one or more wavelet domain waveforms.

11. The method of claim 8, wherein the step of estimating the one or more noise statistics from the one or more wavelet domain waveforms further comprises the steps of:

identifying a portion of one or more of the one or more wavelet domain waveforms; and calculating a standard deviation of the wavelet coefficients comprising each portion of the one or more wavelet domain waveforms.

12. A non-transitory computer readable medium storing a computer program for producing a denoised output waveform from a noisy waveform, the computer program instructing a computing device to perform the steps of:

providing the noisy waveform as an input waveform;

determining a frequency domain noise shape associated with the input waveform; calculating a wavelet domain noise shape from the frequency domain noise shape;

calculating a discrete wavelet transform of the input waveform to form a wavelet domain waveform;

estimating the noise statistics from the wavelet domain waveform;

calculating a threshold from the estimated noise statistics and the wavelet domain noise shape;

applying the threshold to the wavelet domain waveform to form a denoised wavelet domain waveform; and calculating an inverse discrete wavelet transform of the denoised wavelet domain waveform to form a denoised waveform.

13. The non-transitory computer readable medium of claim 12, wherein the denoised waveform contains less noise than the noisy waveform.

14. The non-transitory computer readable medium of claim 12, wherein the calculation of the wavelet domain noise shape further comprises the steps of:
    determining a filter response corresponding to wavelet coefficients associated with the discrete wavelet transform; and
    determining the effect of the application of the discrete wavelet transform to the frequency domain noise shape on each discrete wavelet transform coefficient comprising the wavelet domain waveform.

15. The non-transitory computer readable medium of claim 12, wherein the step of estimating the noise statistics from the wavelet domain waveform further comprises the steps of:
    identifying a portion of the wavelet domain waveform; and
    calculating a standard deviation of the wavelet coefficients comprising the portion of the wavelet domain waveform.

16. The non-transitory computer readable medium of claim 12, wherein the method for producing a denoised output waveform from a noisy waveform is employed in accordance with a time-domain reflectometry measurement.

17. The non-transitory computer readable medium of claim 16, wherein the noisy waveform is a step like waveform at a driven port.

18. The non-transitory computer readable medium of claim 16, wherein the noisy waveform is a step like waveform at a port that is not driven.

19. A non-transitory computer readable medium storing a computer program for producing one or more denoised raw s-parameters from one or more noisy waveforms in accordance with a time-domain reflectometry measurement, the computer program instructing a computing device to perform the steps of:
    providing the one or more noisy waveforms as one or more input waveforms;
    determining one or more frequency domain noise shapes associated with one or more of the one or more input waveforms;
    calculating one or more wavelet domain noise shapes from the one or more frequency domain noise shapes;
    calculating a discrete wavelet transform of each of the one or more input waveforms to form one or more wavelet domain waveforms;
    estimating one or more noise statistics from the one or more wavelet domain waveforms;
    calculating one or more thresholds from the one or more estimated noise statistics and the one or more wavelet domain noise shapes;
    applying the one or more thresholds to the one or more wavelet domain waveforms to form one or more denoised wavelet domain waveforms;
    calculating an inverse discrete wavelet transform of each of the one or more denoised wavelet domain waveforms to form one or more denoised waveforms;
    extracting an incident portion of one or more of the one or more denoised waveforms to form one or more incident denoised waveforms;
    extracting a reflect portion of one or more of the one or more denoised waveforms to form one or more reflect denoised waveforms;
    computing the discrete Fourier transform of one or more of the one or more incident denoised waveforms to form one or more Fourier domain incident denoised waveforms;
    computing the discrete Fourier transform of one or more of the one or more reflect denoised waveforms to form one or more Fourier domain reflect denoised waveforms; and
    computing the element by element ratio of one or more of the one or more Fourier domain reflect denoised waveforms to one or more of the one or more Fourier domain incident denoised waveforms to form one or more denoised raw s-parameters.

20. The non-transitory computer readable medium of claim 19, wherein the measurement dynamic range is improved.

21. The non-transitory computer readable medium of claim 19, wherein the calculation of the one or more wavelet domain noise shapes further comprises the steps of:
    determining one or more filter responses corresponding to wavelet coefficients associated with the one or more discrete wavelet transforms; and
    determining the one or more effects of the application of the one or more discrete wavelet transforms to the one or more frequency domain noise shapes on each discrete wavelet transform coefficient comprising one or more of the one or more wavelet domain waveforms.

22. The non-transitory computer readable medium of claim 19, wherein the step of estimating the one or more noise statistics from the one or more wavelet domain waveforms further comprises the steps of:
    identifying a portion of one or more of the one or more wavelet domain waveforms; and
    calculating a standard deviation of the wavelet coefficients comprising each portion of the one or more wavelet domain waveforms.

23. An apparatus for producing a denoised output waveform from a noisy waveform, comprising:
    an input port receiving the noisy waveform;
    a processor providing the noisy waveform as an input waveform, for determining a frequency domain noise shape associated with the input waveform, calculating a wavelet domain noise shape from the frequency domain noise shape, calculating a discrete wavelet transform of the input waveform to form a wavelet domain waveform, estimating the noise statistics from the wavelet domain waveform, calculating a threshold from the estimated noise statistics and the wavelet domain noise shape, applying the threshold to the wavelet domain waveform to form a denoised wavelet domain waveform, and calculating an inverse discrete wavelet transform of the denoised wavelet domain waveform to form a denoised waveform; and
    an output port outputting the denoised waveform.

24. The apparatus of claim 23, wherein the denoised waveform contains less noise than the noisy waveform.

25. The apparatus of claim 23, wherein the processor calculates the wavelet domain noise shape by determining a filter response corresponding to wavelet coefficients associated with the discrete wavelet transform, and determining the effect of the application of the discrete wavelet transform to the frequency domain noise shape on each discrete wavelet transform coefficient comprising the wavelet domain waveform.

26. The apparatus of claim 23, wherein the processor estimates the noise statistics from the wavelet domain waveform by identifying a portion of the wavelet domain waveform, and calculating a standard deviation of the wavelet coefficients comprising the portion of the wavelet domain waveform.

27. The apparatus of claim 23, wherein the apparatus performs a time-domain reflectometry measurement.

28. The apparatus of claim 27, wherein the noisy waveform is a step like waveform at a driven port.

29. The apparatus of claim 27, wherein the noisy waveform is a step like waveform at a port that is not driven.

30. An apparatus for producing one or more denoised raw s-parameters from one or more noisy waveforms in accordance with a time-domain reflectometry measurement, comprising:
one or more input ports for receiving the one or more noisy waveforms;
a processor configured to provide the one or more noisy waveforms as one or more input waveforms, to determine one or more frequency domain noise shapes associated with one or more of the one or more input waveforms, to calculate one or more wavelet domain noise shapes from the one or more frequency domain noise shapes, to calculate a discrete wavelet transform of each of the one or more input waveforms to form one or more wavelet domain waveforms, to estimate one or more noise statistics from the one or more wavelet domain waveforms, to calculate one or more thresholds from the one or more estimated noise statistics and the one or more wavelet domain noise shapes, to apply the one or more thresholds to the one or more wavelet domain waveforms to form one or more denoised wavelet domain waveforms, to calculate an inverse discrete wavelet transform of each of the one or more denoised wavelet domain waveforms to form one or more denoised waveforms, to extract an incident portion of one or more of the one or more denoised waveforms to form one or more incident denoised waveforms, to extract a reflect portion of one or more of the one or more denoised waveforms to form one or more reflect denoised waveforms, to compute the discrete Fourier transform of one or more of the one or more incident denoised waveforms to form one or more Fourier domain incident denoised waveforms, to compute the discrete Fourier transform of one or more of the one or more reflect denoised waveforms to form one or more Fourier domain reflect denoised waveforms, and to compute the element by element ratio of one or more of the one or more Fourier domain reflect denoised waveforms to one or more of the one or more Fourier domain incident denoised waveforms to form one or more denoised raw s-parameters; and
one or more output ports for outputting one or more of the one or more denoised raw s-parameters.

31. The apparatus of claim 30, wherein a measurement dynamic range of the apparatus is improved.

32. The apparatus of claim 30, wherein the processor calculates the one or more wavelet domain noise shapes by determining one or more filter responses corresponding to wavelet coefficients associated with the one or more discrete wavelet transforms, and determining the one or more effects of the application of the one or more discrete wavelet transforms to the one or more frequency domain noise shapes on each discrete wavelet transform coefficient comprising one or more of the one or more wavelet domain waveforms.

33. The apparatus of claim 30, wherein the processor estimates the one or more noise statistics from the one or more wavelet domain waveforms by identifying a portion of one or more of the one or more wavelet domain waveforms, and calculating a standard deviation of the wavelet coefficients comprising each portion of the one or more wavelet domain waveforms.

* * * * *